(12) United States Patent
Zhang

(10) Patent No.: US 11,716,866 B2
(45) Date of Patent: Aug. 1, 2023

(54) DISPLAY PANEL INCLUDING PLANARIZATION LAYER WITH PROTRUSION AND METHOD OF MANUFACTURING THEREOF

(71) Applicant: Shenzhen China Star Optoelectronics Semiconductor Display Technology Co., Ltd., Shenzhen (CN)

(72) Inventor: Shuren Zhang, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/622,917

(22) PCT Filed: Nov. 21, 2019

(86) PCT No.: PCT/CN2019/120015
§ 371 (c)(1),
(2) Date: Dec. 16, 2019

(87) PCT Pub. No.: WO2021/042577
PCT Pub. Date: Mar. 11, 2021

(65) Prior Publication Data
US 2022/0416185 A1  Dec. 29, 2022

(30) Foreign Application Priority Data
Sep. 6, 2019  (CN) .......................... 201910839671.X

(51) Int. Cl.
*H10K 50/115* (2023.01)
*H10K 50/16* (2023.01)
(Continued)

(52) U.S. Cl.
CPC ......... *H10K 50/115* (2023.02); *H10K 50/166* (2023.02); *H10K 71/00* (2023.02);
(Continued)

(58) Field of Classification Search
None
See application file for complete search history.

(56) References Cited

U.S. PATENT DOCUMENTS

2016/0126499 A1* 5/2016 Dai .................... H01L 27/3211
257/40
2017/0250380 A1 8/2017 Kato
(Continued)

FOREIGN PATENT DOCUMENTS

CN   106328824 A   1/2017
CN   107275499 A   10/2017
(Continued)

*Primary Examiner* — Joe E. Schoenholtz
(74) *Attorney, Agent, or Firm* — PV IP PC; Wei Te Chung; Zhigang Ma

(57) ABSTRACT

A display panel and a method of manufacturing thereof are provided. A hole injection layer, a hole transport layer, a light emitting layer, and a planarization layer are formed by an inkjet-printing method. Specifically, solvents including hole injecting layer material, hole transporting layer material, light emitting layer material, and planarization layer material are evaporated by vacuum drying so as to uniformize the surface of the entire layer, thereby improving light uniformity. Moreover, a notch of the light emitting layer can be effectively filled by disposing a planarization layer on the light emitting layer, so a uniform layer can be formed, which can reduce the current accumulated at the notch. Therefore, the light uniformity of the display panel is improved, and the risk of leakage current at the notch is also reduced.

10 Claims, 2 Drawing Sheets

(51) Int. Cl.
*H10K 71/00* (2023.01)
*H10K 50/17* (2023.01)
*H10K 77/10* (2023.01)
*H10K 102/00* (2023.01)

(52) U.S. Cl.
CPC ............ *H10K 50/17* (2023.02); *H10K 77/111* (2023.02); *H10K 2102/311* (2023.02); *H10K 2102/351* (2023.02)

(56) References Cited

U.S. PATENT DOCUMENTS

| 2018/0151817 | A1* | 5/2018 | Cho | .................... | C09K 11/025 |
| 2019/0288225 | A1 | 9/2019 | Chen et al. | | |
| 2021/0036253 | A1* | 2/2021 | Asaoka | .................. | H01L 27/32 |
| 2021/0305527 | A1* | 9/2021 | Chen | .................... | H01L 51/502 |

FOREIGN PATENT DOCUMENTS

| CN | 108447998 A | 8/2018 |
| CN | 109390476 A | 2/2019 |

* cited by examiner

DISPLAY PANEL INCLUDING PLANARIZATION LAYER WITH PROTRUSION AND METHOD OF MANUFACTURING THEREOF

BACKGROUND OF INVENTION

Field of Invention

The present invention relates to the field of display technology, and more particularly, to a display panel and a method of manufacturing thereof.

Description of Prior Art

Quantum-dot light-emitting diode (QLED) is a self-luminous technology that does not require a backlight. Due to the solution processing characteristics of quantum dots, the quantum dot light emitting layer can be formed by spin-coating, blade-coating, inkjet-printing, etc. Compared with the previous methods, inkjet-printing technology can accurately deposit quantum dot light emitting materials at appropriate positions, and uniformly deposit semiconductor materials to form thin film layers. Therefore, a utilization rate of materials is very high, which can reduce production cost and simplify fabrication process, and it is expected to achieve mass production. Inkjet-printing technology is currently regarded as an effective method to solve the problem of large-size QLED screen manufacturing.

The uniformity of the film surface after inkjet-printing is mainly affected by the "coffee ring" effect. The uniformity of the film surface directly affects the efficiency and life of the device. Therefore, the "coffee ring" effect should be minimized during the printing process. The quantum dot films formed by inkjet-printing not only faces the problem of "coffee ring" but also has a high and low undulating shape due to large volume and easy aggregation. Since the resistance at the lower portion is relatively low, more current flows at a lower portion, so that the lower portion is brighter and the film uniformity is poor.

Therefore, it is urgent to provide a new display panel for solving the problem of uneven illumination caused by uneven film thickness.

SUMMARY OF INVENTION

It is an object of the present invention to provide a display panel and a method of manufacturing thereof, which can effectively solve the problem of uneven illumination caused by uneven film thickness.

A display panel includes: a substrate and an organic functional layer disposed on the substrate and surrounded by a pixel defining layer. The organic functional layer includes: a first electrode disposed on the substrate; a hole injection layer disposed on a side of the first electrode away from the organic functional layer; a hole transport layer disposed on a side of the hole injection layer away from the first electrode; a light emitting layer disposed on a side of the hole transport layer away from the hole injection layer; a planarization layer disposed on a side of the light emitting layer away from the hole transport layer; an electron transport layer disposed on a side of the planarization layer away from the light emitting layer; an electron injection layer disposed on a side of the electron transport layer away from the planarization layer; and a second electrode disposed on a side of the electron injection layer away from the electron transport layer. At least one notch is formed on a side of the light emitting layer attached to the planarization layer, at least one protrusion is formed on a side of the planarization layer attached to the light emitting layer, and the at least one protrusion is correspondingly fitted with the at least one notch.

In one embodiment, the at least one notch is continuously distributed on the light emitting layer, and the at least one protrusion is continuously distributed on a side of the planarization layer close to the light emitting layer.

In one embodiment, a thickness of the planarization is 5 nm to 20 nm.

In one embodiment, material of the planarization layer comprises polymethyl methacrylate, polyvinylpyrrolidone, and polystyrene.

In one embodiment, the planarization layer and the electron transport layer are made of a same material.

In one embodiment, the light emitting layer comprises a plurality of quantum dots.

A method of manufacturing a display panel includes following steps: providing a substrate, and the substrate includes a functional region; forming a pixel defining layer on the substrate, and the pixel defining layer surrounds the functional region; forming a first electrode on the functional region, and the first electrode is attached to the substrate; injecting a hole injecting material ink onto the first electrode, vacuum drying to remove a hole injecting material ink solvent, and baking to form a hole injection layer; injecting a hole transporting material ink onto the hole injection layer, and vacuum drying to remove a hole transporting material ink solvent, and baking to form a hole transport layer; injecting a quantum dot light emitting material ink onto the hole transport layer, and vacuum drying to remove a quantum dot light emitting material ink solvent, and baking to form a light emitting layer; injecting a planarization layer material ink onto the light emitting layer, and vacuum drying to remove a planarization layer material ink solvent, and baking to form a planarization layer; forming an electron transport layer on the planarization layer; forming an electron injection layer on the electron transport layer; and forming a second electrode on the electron injection layer.

In one embodiment, the step of forming an electron transport layer on the planarization layer is performed by evaporation, and the step of forming an electron injection layer on the electron transport layer is performed by evaporation.

In one embodiment, the step of forming an electron transport layer on the planarization layer is performed by inkjet-printing, and includes injecting an electron transport layer material ink onto the light emitting layer, vacuum drying to remove an electron transport layer material ink solvent, and baking to form the electron transport layer.

In one embodiment, the step of forming an electron injection layer on the electron transport layer is performed by inkjet-printing, and includes injecting an electron injection layer material ink onto the electron transport layer, vacuum drying to remove an electron injection layer material ink solvent, and baking to form the electron injection layer.

A display panel and a method of manufacturing thereof are provided. A hole injection layer, a hole transport layer, a light emitting layer, and a planarization layer are formed by an inkjet-printing method. Specifically, solvents including hole injecting layer material, hole transporting layer material, light emitting layer material, and planarization layer material are evaporated by vacuum drying so as to uniformize the surface of the entire layer, thereby improving light uniformity. Moreover, a notch of the light emitting layer can be effectively filled by disposing a planarization layer on the light emitting layer, so a uniform layer can be formed, which can reduce the current accumulated at the notch. Therefore, the light uniformity of the display panel is improved, and the risk of leakage current at the notch is also reduced.

BRIEF DESCRIPTION OF DRAWINGS

In order to more clearly illustrate the technical solutions in the embodiments, the drawings described in the description of the embodiments are briefly described below. It is obvious that the drawings in the following description are only some embodiments of the present invention. Other drawings can also be obtained from those skilled persons in the art based on drawings without any creative effort.

Figure 1:
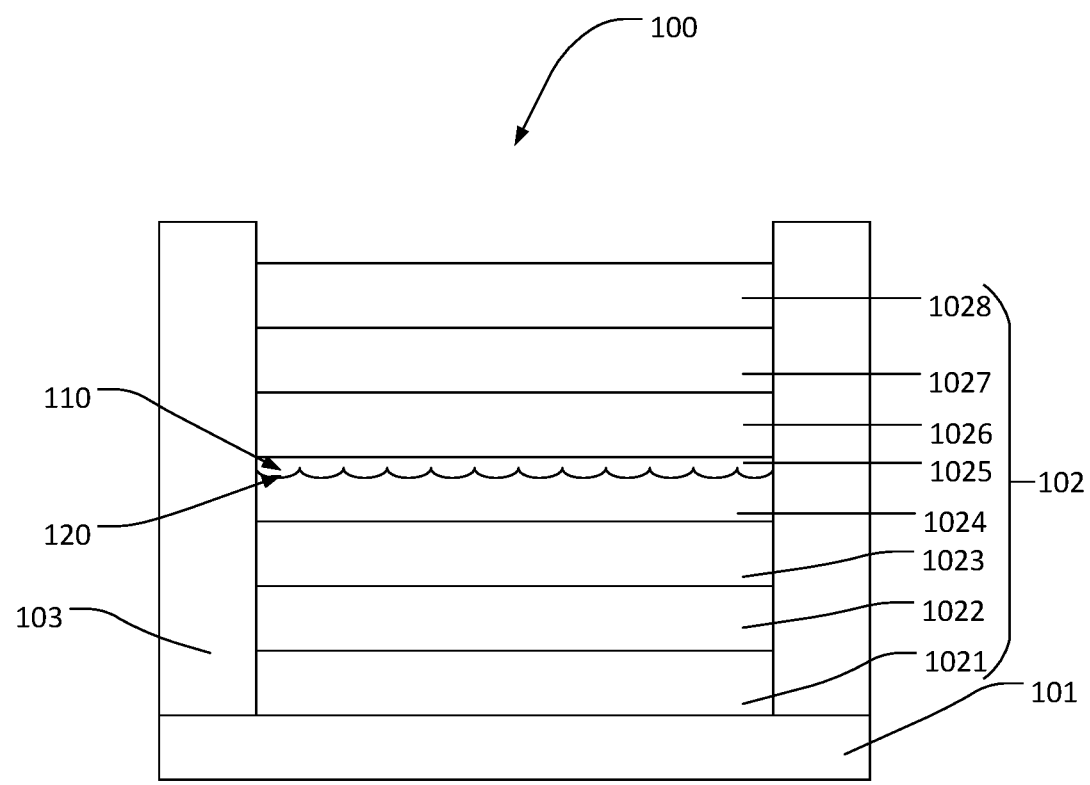
FIG. 1 is a schematic structural view of a display panel according to one embodiment the present invention.

REFERENCE NUMERALS display panel 100; substrate 101; organic functional layer 102; hole layer 103; first electrode 1021; hole injection layer 1022; hole transport layer 1023; light emitting layer 1024; planarization layer 1025; electron transport layer 1026; electron injection layer 1027; second electrode 1028; functional area 130; notch 110; and protrusion 120.

DETAILED DESCRIPTION OF PREFERRED EMBODIMENTS

The following description of the various embodiments is provided with reference to the accompanying drawings. The directional terms mentioned in the present invention, such as "upper," "lower," "front," "back," "left," "right," "inside," "outside," "side," etc., are merely indicated the direction of the drawings. The names of the elements mentioned in the present invention, such as the first, second, etc., are only distinguishing between different components and can be better expressed. In the drawings, structurally similar elements are indicated by the same reference numerals.

Embodiments of the present invention are described in detail herein with reference to the drawings. The present invention may be embodied in many different forms and the invention is not to be construed as being limited to the specific embodiments set forth herein. The embodiments of the present invention are provided to explain the practical application so that those skilled persons in the art can understand various embodiments of the present invention and various modifications suitable for the particular intended application.

Referring to FIG. 1, in an embodiment, a display panel 100 is provided in the present application, wherein the display panel 100 includes a substrate 101 and an organic functional layer 102.

The organic functional layer 102 is disposed on the substrate 101 and is surrounded by a pixel defining layer 103.

The organic functional layer 102 includes: a first electrode 1021, a hole injection layer 1022, a hole transport layer 1023, a light emitting layer 1024, a planarization layer 1025, an electron transport layer 1026, an electron injection layer 1027 and a second electrode 1028.

The first electrode 1021 is disposed on the substrate 101, and the first electrode 1021 is an anode.

The hole injection layer 1022 is disposed on a side of the first electrode 1021 away from the organic functional layer 102. The hole transport layer 1023 is disposed on a side of the hole injection layer 1022 away from the first electrode 1021.

The light emitting layer 1024 is disposed on a side of the hole transport layer 1023 away from the hole injection layer 1022. The light emitting layer 1024 has a plurality of quantum dots.

At least one notch 110 is formed on a side of the light emitting layer 1024 attached to the planarization layer 1025. The notch 110 is continuously distributed on the light emitting layer 1024 to form an uneven layer.

The planarization layer 1025 is disposed on a side of the light emitting layer 1024 away from the hole transport layer 1023. A thickness of the planarization is 5 nm to 20 nm.

In an embodiment, the material of the planarization layer 1025 includes polymethyl methacrylate, polyvinylpyrrolidone, and polystyrene. In another embodiment, the material of the planarization layer 1025 may be insulating. The planarization layer 1025 and the electron transport layer 1026 are made of a same material, and have a similar quantum dot carrier mobility.

At least one protrusion 120 is formed on a side of the planarization layer 1025 attached to the light emitting layer 1024, and the at least one protrusion 120 is continuously distributed on a side of the planarization layer 1025 close to the light emitting layer 1024. The at least one protrusion 120 is correspondingly fitted with the at least one notch 110 to flatten the surface of the light emitting layer 1024. The surface uniformity of the other side of the planarization layer 1025 is greater than 90%.

The electron transport layer 1026 is disposed on a side of the planarization layer 1025 away from the light emitting layer 1024. The electron injection layer 1027 is disposed on a side of the electron transport layer 1026 away from the planarization layer 1025. The second electrode 1028 is disposed on a side of the electron injection layer 1027 away from the electron transport layer 1026.

In the present embodiment, a display panel 100 is provided. By providing a planarization layer 1025 on the light emitting layer 1024, the notch 110 of the light emitting layer 1024 can be effectively filled to form a uniform layer, so that the current accumulated at the notch 110 can be reduced, thereby improving the light uniformity of the display panel 100, and reducing the risk of leakage current at the notch 110.

A method of manufacturing a display panel is provided in the present application, and the method includes the following steps.

Figure 2:
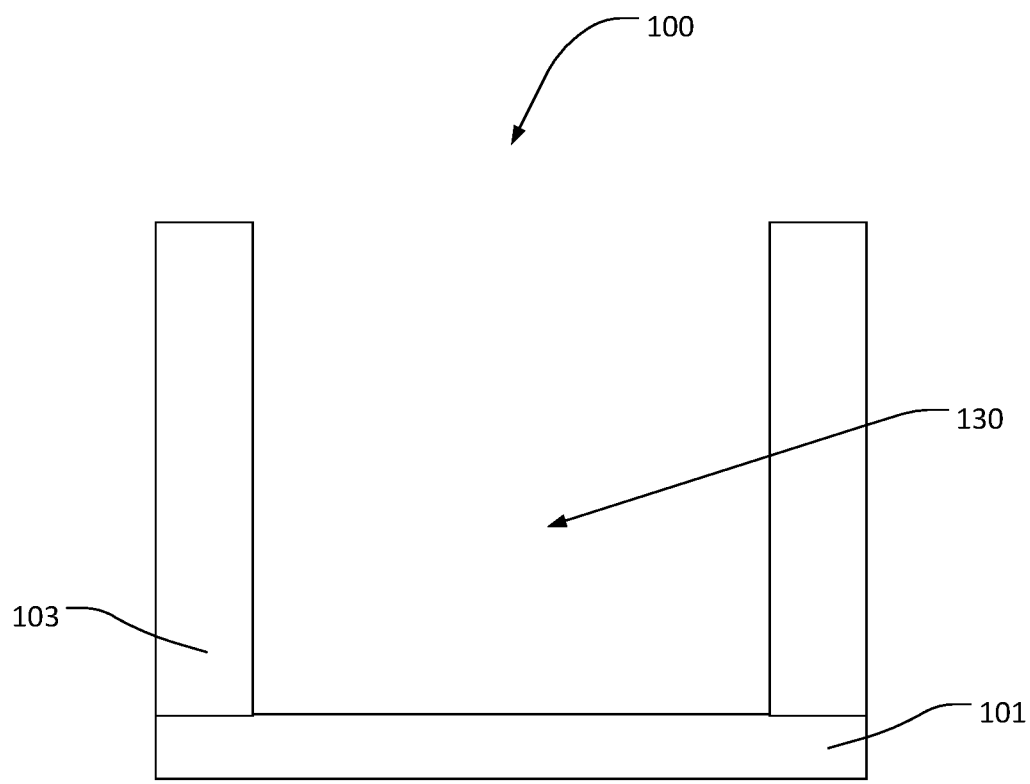
FIG. 2 is a partial structural schematic view of the display panel according to one embodiment of the present invention.

Step S1, referring to FIG. 2, a substrate 101 is provided, and the substrate 101 has a functional region 130.

Step S2, a pixel defining layer 103 is formed on the substrate 101, wherein the pixel defining layer 103 surrounds the functional region 130.

Step S3, a first electrode 1021 is formed in the pixel defining layer 103, wherein the first electrode 1021 is attached to the substrate 101.

Step S4, a hole injecting material ink is injected onto the first electrode 1021, a hole injecting material ink solvent is removed by vacuum drying, and then a hole injection layer 1022 is formed by baking.

Step S5, a hole transporting material ink is injected onto the hole injection layer 1022, a hole transporting material ink solvent is removed by vacuum drying, and then a hole transport layer 1023 is formed by baking.

Step S6, a quantum dot light emitting material ink is injected onto the hole transport layer 1023, a quantum dot light emitting material ink solvent is removed by vacuum drying, and then a light emitting layer 1024 is formed by baking. The light emitting layer 1024 is affected by the "aggregation" effect. As such, the upper surface of the light emitting layer 1024 is uneven and has a continuous plurality of notches 110.

Step S7, a planarization layer material ink is injected onto the light emitting layer 1024, a planarization layer material ink solvent is removed by vacuum drying, and then a planarization layer 1025 is formed by baking. The planarization layer 1025 is filled in the plurality of notches 110 to uniform the layer.

Step S8, an electron transport layer 1026 is formed on the planarization layer 1025. The step of forming an electron transport layer 1026 on the planarization layer 1025 is performed by evaporation or inkjet-printing.

If the electron transport layer 1026 is formed by inkjet-printing, the specific steps include: injecting an electron transport layer material ink onto the planarization layer 1025, and vacuum drying to remove the electron transport layer material ink solvent, and baking to form the electron transport layer 1026.

Step S9, an electron injection layer 1027 is formed on the electron transport layer 1026. The step of forming an electron injection layer 1027 on the electron transport layer 1026 is performed by evaporation or inkjet-printing.

If the electron injection layer 1027 is formed by inkjet-printing, the specific steps include: injecting the electron injection layer material ink onto the electron transport layer 1026, and vacuum drying to remove the electron injection layer material ink solvent, and baking to form the electron injection layer 1027.

Step S10, a second electrode 1028 is formed on the electron injection layer 1027 to form an organic functional layer 102.

A method of manufacturing the display panel is provided in the present application. A hole injection layer 1022, a hole transport layer 1023, a light emitting layer 1024, and a planarization layer 1025 are formed by an inkjet-printing method. Specifically, solvents including hole injecting layer material, hole transporting layer material, light emitting layer material, and planarization layer material are evaporated by vacuum drying so as to uniform the surface of the entire layer, thereby improving light uniformity. Moreover, a notch 110 of the light emitting layer 1024 can be effectively filled by disposing a planarization layer 1025 on the light emitting layer 1024, so a uniform layer can be formed, which can reduce the current accumulated at the notch 110. Therefore, the light uniformity of the display panel is improved, and the risk of leakage current at the notch 110 is also reduced.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A display panel, comprising:
   a substrate; and
   an organic functional layer disposed on the substrate and surrounded by a pixel defining layer;
   wherein the organic functional layer comprises:
   a first electrode disposed on the substrate;
   a hole injection layer disposed on a side of the first electrode away from the organic functional layer;
   a hole transport layer disposed on a side of the hole injection layer away from the first electrode;
   a light emitting layer disposed on a side of the hole transport layer away from the hole injection layer;
   a planarization layer disposed on a side of the light emitting layer away from the hole transport layer;
   an electron transport layer disposed on a side of the planarization layer away from the light emitting layer;
   an electron injection layer disposed on a side of the electron transport layer away from the planarization layer; and
   a second electrode disposed on a side of the electron injection layer away from the electron transport layer;
   wherein at least one notch is formed on a side of the light emitting layer attached to the planarization layer, at least one protrusion is formed on a side of the planarization layer attached to the light emitting layer, and the at least one protrusion is correspondingly fitted with the at least one notch.

2. The display panel according to claim 1, wherein the at least one notch is continuously distributed on the light emitting layer, and the at least one protrusion is continuously distributed on a side of the planarization layer close to the light emitting layer.

3. The display panel according to claim 1, wherein a thickness of the planarization is 5 nm to 20 nm.

4. The display panel according to claim 1, wherein material of the planarization layer comprises polymethyl methacrylate, polyvinylpyrrolidone, and polystyrene.

5. The display panel according to claim 1, wherein the planarization layer and the electron transport layer are made of a same material to form a monolithic structure, the monolithic structure is disposed between the electron injection layer and the light emitting layer, and the at least one protrusion is formed on a side of the monolithic structure attached to the light emitting layer.

6. The display panel according to claim 1, wherein the light emitting layer comprises a plurality of quantum dots.

7. A method of manufacturing a display panel, comprising following steps:
   providing a substrate, wherein the substrate comprises a functional region;
   forming a pixel defining layer on the substrate, wherein the pixel defining layer surrounds the functional region;
   forming a first electrode on the functional region, wherein the first electrode is attached to the substrate;
   injecting a hole injecting material ink onto the first electrode, vacuum drying to remove a hole injecting material ink solvent, and baking to form a hole injection layer;
   injecting a hole transporting material ink onto the hole injection layer, and vacuum drying to remove a hole transporting material ink solvent, and baking to form a hole transport layer;
   injecting a quantum dot light emitting material ink onto the hole transport layer, and vacuum drying to remove a quantum dot light emitting material ink solvent, and baking to form a light emitting layer;
   injecting a planarization layer material ink onto the light emitting layer, and vacuum drying to remove a planarization layer material ink solvent, and baking to form a planarization layer;
   forming an electron transport layer on the planarization layer;

forming an electron injection layer on the electron transport layer; and forming a second electrode on the electron injection layer.

8. The method of manufacturing the display panel according to claim 7, wherein the step of forming an electron transport layer on the planarization layer is performed by evaporation, and the step of forming an electron injection layer on the electron transport layer is performed by evaporation.

9. The method of manufacturing the display panel according to claim 7, wherein the step of forming an electron transport layer on the planarization layer is performed by inkjet-printing, and comprises injecting an electron transport layer material ink onto the light emitting layer, vacuum drying to remove an electron transport layer material ink solvent, and baking to form the electron transport layer.

10. The method of manufacturing the display panel according to claim 8, wherein the step of forming an electron injection layer on the electron transport layer is performed by inkjet-printing, and comprises injecting an electron injection layer material ink onto the electron transport layer, vacuum drying to remove an electron injection layer material ink solvent, and baking to form the electron injection layer.

* * * * *